(12) United States Patent
Hu et al.

(10) Patent No.: US 7,560,640 B2
(45) Date of Patent: Jul. 14, 2009

(54) DENSELY PACKED THERMOELECTRIC COOLER

(75) Inventors: Chuan Hu, Chandler, AZ (US); David S. Chau, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 596 days.

(21) Appl. No.: 10/996,195

(22) Filed: Nov. 22, 2004

(65) Prior Publication Data

US 2006/0107988 A1    May 25, 2006

(51) Int. Cl.
*H01L 35/28* (2006.01)
(52) U.S. Cl. .................. 136/224; 136/201; 136/228
(58) Field of Classification Search ............. 136/211, 136/224; 257/467
See application file for complete search history.

(56) References Cited

U.S. PATENT DOCUMENTS

| | | | | |
|---|---|---|---|---|
| 5,040,381 A | * | 8/1991 | Hazen | 62/3.2 |
| 5,430,322 A | * | 7/1995 | Koyanagi et al. | 257/467 |
| 6,274,802 B1 | * | 8/2001 | Fukuda et al. | 136/201 |
| 6,329,217 B1 | * | 12/2001 | Watanabe et al. | 438/48 |
| 6,639,242 B1 | * | 10/2003 | Chen et al. | 257/19 |
| 2005/0139249 A1 | * | 6/2005 | Ueki et al. | 136/211 |

FOREIGN PATENT DOCUMENTS

WO    PCT/JP03/07194    * 12/2003    ............ 136/211

* cited by examiner

*Primary Examiner*—Alexa D Neckel
*Assistant Examiner*—Miriam Berdichevsky
(74) *Attorney, Agent, or Firm*—Blakely, Sokoloff, Taylor & Zafman LLP

(57) ABSTRACT

Embodiments of the invention provide a thin film thermoelectric cooler. The cooler may have a high packing density that provides good cooling performance. The cooler may be formed by forming a first set of cooling elements, depositing a conformal insulating layer on the first set, then forming a second set of cooling elements between the first set of elements.

19 Claims, 6 Drawing Sheets

DENSELY PACKED THERMOELECTRIC COOLER

BACKGROUND

Background of the Invention

FIGS. 1a and 1b are cross sectional side views illustrating how a prior art thermoelectric cooler (TEC) may be formed. As seen in FIG. 1a, a first substrate 102 may have a first set of thermoelectric cooling elements 104 formed thereon. A second substrate 106 may have a second set of thermoelectric cooling elements 108 formed thereon. The substrates 102, 106 may be attached or bonded together, as indicated by the arrow in FIG. 1a, and connected to result in the device 100 of FIG. 1b.

The device 100 of FIG. 1b includes the thermoelectric cooling elements 104 and 108. There may be large distances 110 between the elements of the two sets of thermoelectric cooling elements 104, 108, which may provide a margin of error required by the positioning and connecting of the substrates 102, 106; the distance 110 may help ensure that the elements 104, 108 do not touch each other should the positioning be inaccurate. The distances 110 required to provide this margin of error may prevent a packing density of the elements 104, 108 from being more than about 65% (where packing density is the percentage of footprint area covered by the elements 104, 108). The widths 112 of the elements 104, 108 may be about 500 microns to about 1 millimeter, with the distance 110 being about one-half of the widths 112. Further, the thickness 114 of the device 100 may be about 140 microns or more. Such a thick device 100 with a low packing density may have limited cooling capability.

DETAILED DESCRIPTION

In various embodiments, an apparatus and method relating to the formation of a substrate are described. In the following description, various embodiments will be described. However, one skilled in the relevant art will recognize that the various embodiments may be practiced without one or more of the specific details, or with other methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Figure 1A:
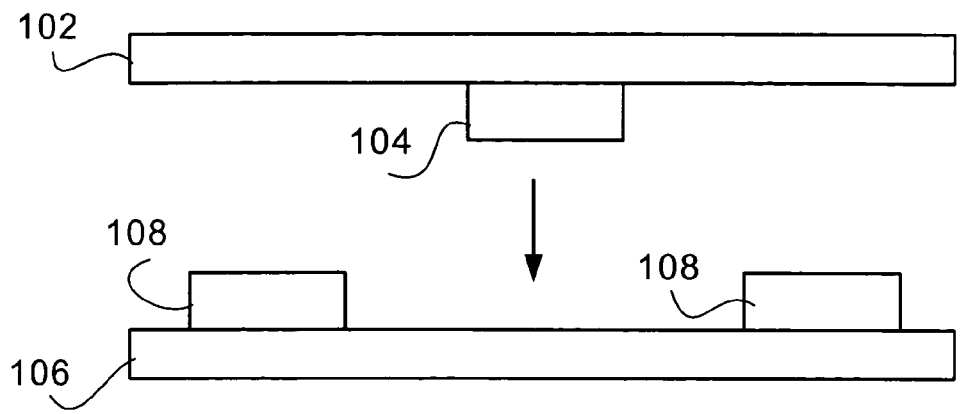
FIGS. 1a and 1b are cross sectional side views illustrating a prior art thermoelectric cooler.
Figure 1B:
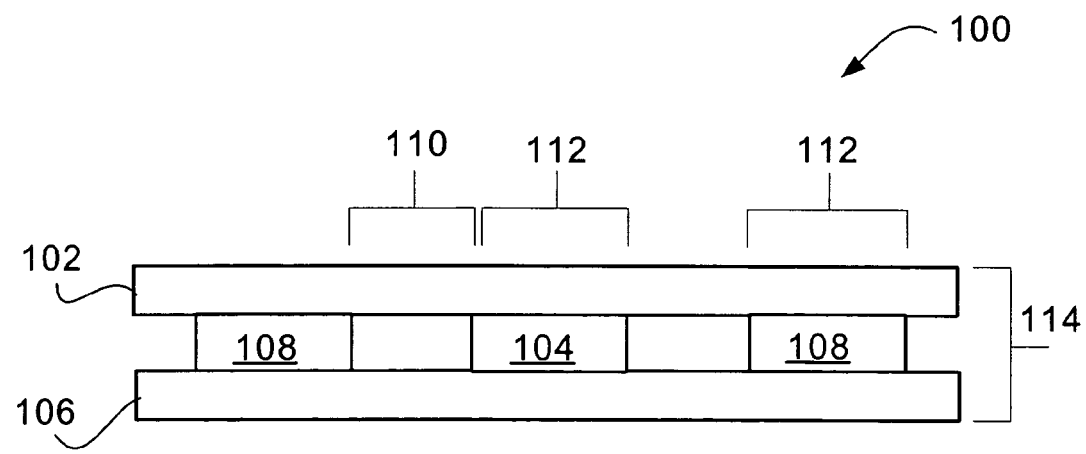
Figure 2:
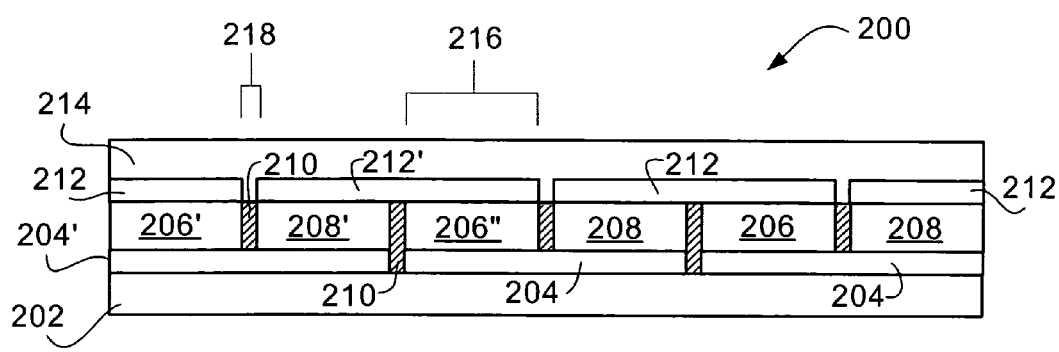
FIG. 2 is a cross sectional side view that illustrates a generalized thin film thermoelectric cooler.

FIG. 2 is a cross sectional side view that illustrates a generalized thin film thermoelectric cooler (TFTEC) 200, according to one embodiment of the present invention. The cooler 200 may include a substrate 202. The substrate 202 may comprise a piece of material, such as a piece of silicon or other material. The substrate 202 may be a physical structure, a layer that is a basic workpiece transformed and/or added to by various processes into the desired microelectronic configuration, or another material or materials. The substrate 202 may include conducting material, insulating material, semiconducting material, and other materials or material combinations. In some embodiments, the substrate 202 may be a multi-layered structure. On a side, such as the bottom side of the substrate 202, there may be active or passive devices. Alternatively, the substrate 202 may comprise a substantially homogeneous piece of material without additional devices or structures.

There may be one or more bottom electrodes 204 on the substrate 202. On one or more of the bottom electrodes 204 there may be thermoelectric cooling elements 206, 208. The elements 206, 208 may comprise a thermoelectric cooling material, with the first set of elements 206 being doped one way (n- or p-doped) and the second set of elements 208 being doped oppositely to the first set 206. In an embodiment, one element from the first set 206 may and one element from the second set 208 may be in direct electrical contact with each bottom electrode 204. In other embodiments, multiple elements from each set may be in contact with each bottom electrode 204.

There may be a thin layer of insulating material 210 between the different elements 206, 208. The insulating material 210 may electrically insulate the side walls of each element 206, 208 from the side walls of other elements 206, 208. The thickness 218 of the insulating material 210 may be quite thin compared to the widths 216 of the cooling elements 206, 208. For example, in an embodiment, elements 206, 208 may have widths 216 ten times as great as the thickness 218 of the insulating material 218. In other embodiments, the elements 206, 208 may have widths 216 fifty times as great, one hundred times as great, as the thickness 218 of the insulating material 218, or even greater.

Thus, in some embodiments, the elements 206, 208 may be located quite close together. This may result in a packing density of the cooling elements 206, 208 of above about 70%, above about 90%, or at or above 99% in some embodiments, where the packing density is the percentage of a footprint area covered by the elements 206, 208. Coolers 200 with higher packing densities may be capable of more cooling per unit of area than coolers 200 with lower packing densities, and thus may be better at cooling down heat-producing devices with small surface areas, such as microelectronic dies.

There may be one or more top electrodes 212 on the elements 206, 208. In an embodiment, one element from the first set 206 may and one element from the second set 208 may be in direct electrical contact with each top electrode 212. In other embodiments, multiple elements from each set may be in contact with each top electrode 212. However, in some embodiments, the elements 206, 208 that are in electrical contact with a bottom electrode 204 may not all also be in direct electrical contact with a top electrode 212. For example, in the embodiment illustrated in FIG. 2, elements 206' and 208' are on bottom electrode 204' and in direct electrical contact with bottom electrode 204'. However, while element 208' is in direct electrical contact with top electrode 212', element 206' is not. Rather, element 206" is in direct electrical contact with top electrode 212'. This arrangement allows for an electrical path that travels through the illustrated elements serially, rather than in parallel.

There may be a top layer 214 on the top electrodes 212. The top layer 214 may be a layer of passivating, protective, or other material that may prevent contamination and/or mechanical damage to the other structures of the device 200. In some embodiments, the top layer 214 may comprise an oxide, a polymer, or another material.

FIGS. 3a through 3h are cross sectional side views that illustrate various stages in making the thermoelectric cooler 200 of FIG. 2, according to one embodiment of the present invention.

Figure 3A:
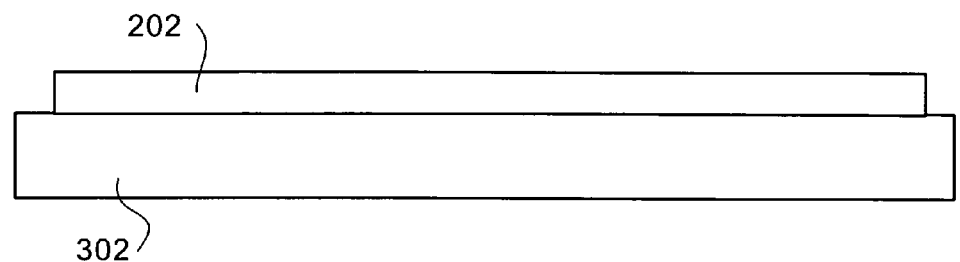
FIGS. 3a through 3h are cross sectional side views that illustrate various stages in making the thermoelectric cooler.

FIG. 3a is a cross sectional side view that illustrates the substrate 202 according to one embodiment. In an embodiment, the substrate 202 may comprise silicon, although in other embodiments the substrate 202 may comprise a different material. The substrate 202 may be mounted on a handling or support structure 302, which may be a support wafer comprised of any suitable material to provide mechanical support and stability to the substrate 202 during processing and/or make the substrate 202 easier to handle during processing. In an embodiment, a relatively thick piece of silicon may be mounted to the support structure 302 and then thinned to result in the substrate 202.

Figure 3B:
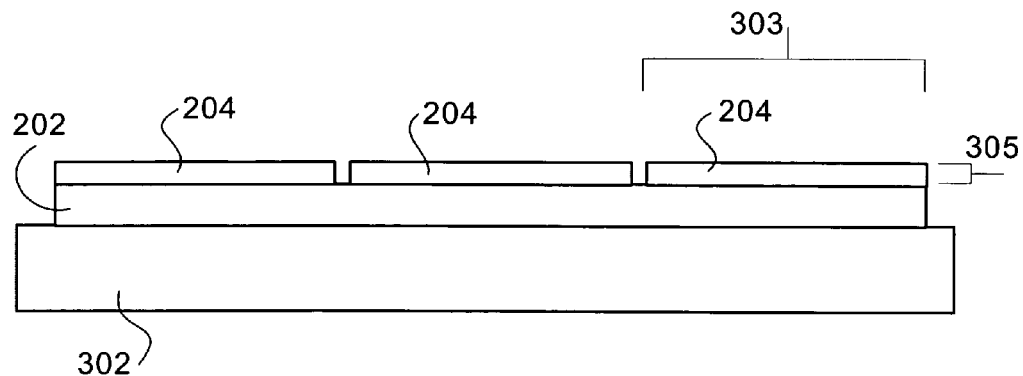

FIG. 3b is a cross sectional side view that illustrates bottom electrodes 204 that have been formed on the substrate 202 according to one embodiment. In an embodiment, the electrodes 204 may be patterned and formed by a method such as electroplating or another suitable method. The electrodes 204 may comprise any suitable electrically conductive material, such as copper, gold, or another material or materials. In an embodiment, the conductors 204 may have a width 303 large enough so that two elements 206, 208 may be on top of the element 204, the elements being separated by insulating material 210. In other embodiments, the conductors 204 may have different widths 303; for example, an element 206, 208 may be only partially on the electrode 204 rather than completely on top of the electrode 204. In an embodiment, the electrodes 204 may have a thickness 305 between about 2 microns and about 5 microns, although in other embodiments, the electrodes 204 may have other thicknesses 305.

Figure 3C:
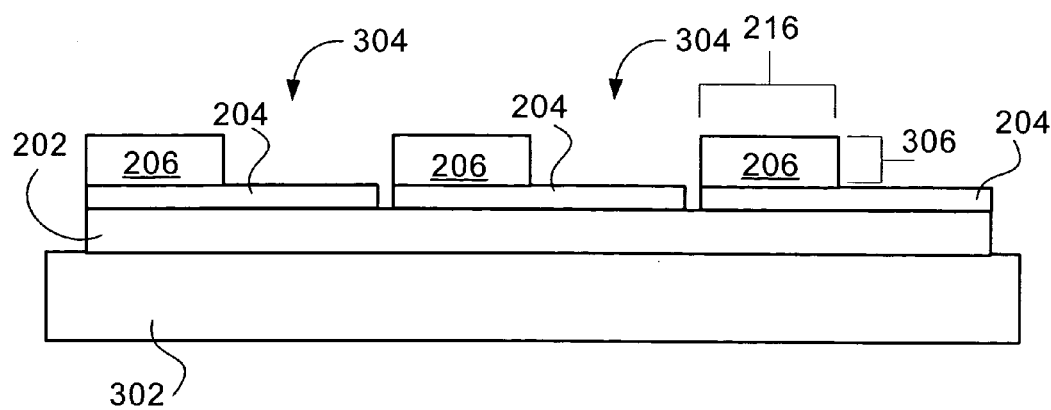

FIG. 3c is a cross sectional side view that illustrates elements 206 of the first set of elements 206 that have been formed on the bottom electrodes 204. The first set of elements 206 may comprise a doped thermoelectric cooling material such as bismuth telluride, lead telluride, silicon germanium, bismuth antimony, or other materials in various embodiments. In an embodiment, the first set of elements 206 may n- or p- doped. In an embodiment, the first set of elements 206 may be formed by forming a layer of thermoelectric cooling material on the electrodes 204 and substrate 202. The layer of thermoelectric cooling material may be formed by a process such as sputtering or another process. The layer of thermoelectric cooling material may be doped while it is being formed in an embodiment. The layer of thermoelectric cooling material, and thus the elements 206, may have a thickness 306 of between about 10 microns and about 50 microns in some embodiments, although the elements 206 may be thinner or thicker in other embodiments. In an embodiment, the elements 206 may have a thickness of about 20 microns.

Portions of the layer of thermoelectric cooling material may then be removed, leaving the discrete elements 206 separated by trenches 304. Such patterning may be performed by a process such as lithography and etching, or other suitable methods. The resulting elements 206 may have a width 216 of about 100 microns in one embodiment. In another embodiment, the elements 206 may have a width 216 of between about 50 microns and about 150 microns, although the elements 206 may have smaller or greater widths 216 in other embodiments. In some embodiments, the elements 206 may be approximately square as seen from the top, with a length approximately equal to the width 216, although in other embodiments, the elements 206 may have other shapes, such as rectangular.

Figure 3D:
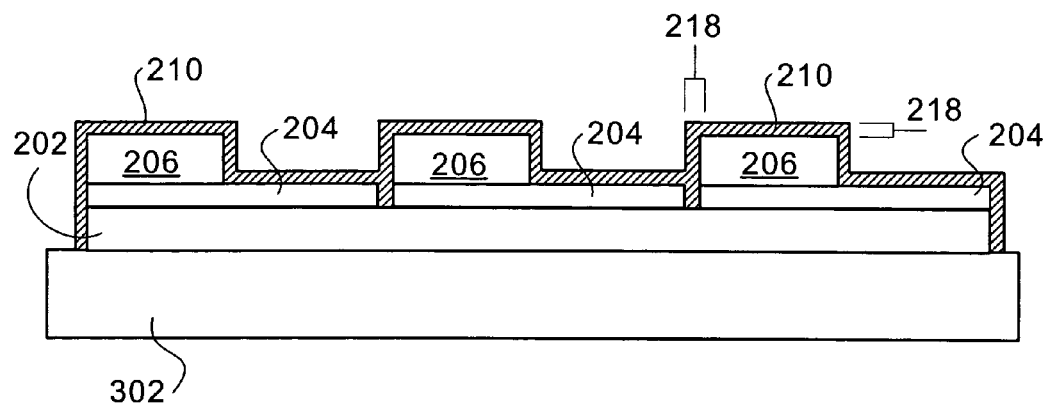

FIG. 3d is a cross sectional side view that illustrates a conformal insulating layer 210 formed on the first set of elements 206 according to one embodiment. The insulating layer 210 may comprise any material that provides electrical insulation, such as an oxide, a material, or another material. In another embodiment, rather than being conformal and covering the elements 206, electrodes 204, and substrate 202, the insulating material layer 210 may cover selected portions of the elements 206 and/or other structures. The insulating layer 210 may have a thickness 218 of about one micron in an embodiment. In another embodiment, the insulating layer 218 of about 2 microns. In other embodiments, the insulating layer 210 may have other thicknesses 218. Thus, in some embodiments, the width 216 of the element 206 may be about 100 times the thickness 218 of the insulating layer 210. In another embodiment, the width 216 of the element 206 may be about 50 times the thickness 218 of the insulating layer 210. In yet another embodiment, the width 216 of the element 206 may be about ten times the thickness 218 of the insulating layer 210. In other embodiments, there may be different ratios between the width 216 of the element 206 and the thickness 218 of the insulating layer 210.

Figure 3E:
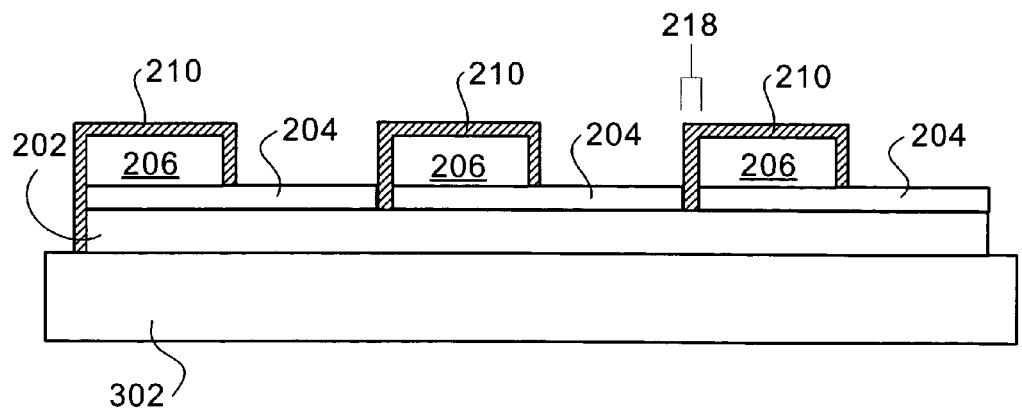

FIG. 3e is a cross sectional side view that illustrates the insulating layer 210 after portions of the insulating layer 210 have been removed, according to one embodiment. In an embodiment, portions of the insulating layer at bottoms of the trenches 304 may be removed to expose at least some of the surface of the bottom electrodes 204. This removal may be done by any suitable method, such as patterning to protect portions of the insulating layer 210 one desires to remain in place, then using wet or dry etching, ion etching, or other methods to remove the unprotected portions.

Figure 3F:
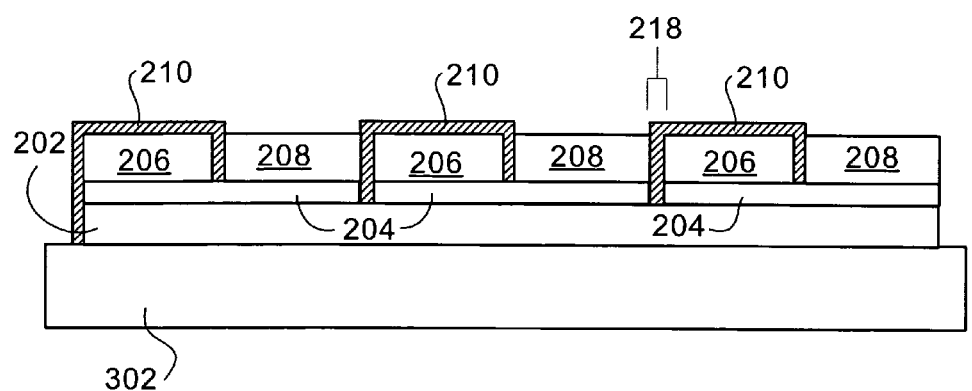

FIG. 3f is a cross sectional side view that illustrates elements 208 of the second set of elements 208 that have been formed in the trenches 304 between the first elements 206, according to one embodiment. In an embodiment, the second set of elements 208 may be formed by masking areas of the device 200 on which the elements 208 are not to be formed, forming a layer of thermoelectric cooling material, then removing portions of the layer of thermoelectric cooling material to leave behind the elements 208. The elements 208 of the second set of elements 208 may be formed and doped similarly to the elements 206 of the first set of elements 206, with the exception that the elements 208 of the second set of elements 208 may be doped oppositely to the first set of elements 206.

Figure 3G:
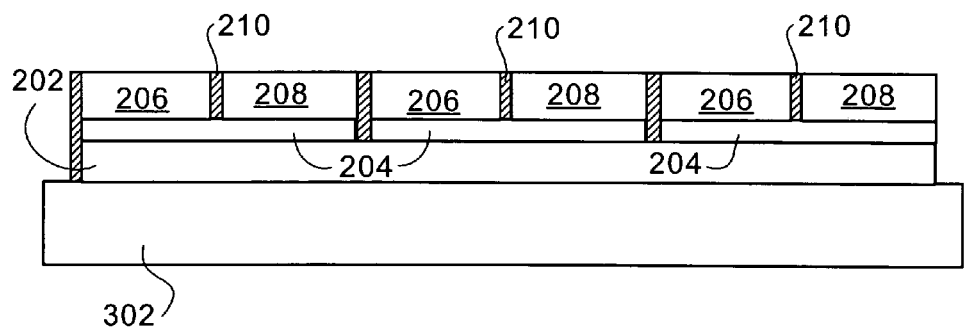

FIG. 3g is a cross sectional side view that illustrates the device 200 after portions of the insulating layer 210 have been removed from top surfaces of the first set of elements 206, according to one embodiment. These portions may be removed by any suitable method, such as one of the methods described with respect to FIG. 3e. The top of the elements 206, 208 may also be planarized, such as by a chemical-mechanical planarizing process or other planarizing process, so that a top electrode 212 may make contact with the top surfaces of both sets of elements 206, 208. In an embodiment, rather than performing separate processes to remove portions of the insulating layer 210 from top surfaces of the first set of elements 206 and to planarize, a single planarizing process may also remove portions of the insulating layer 210 from top surfaces of the first set of elements 206.

Figure 3H:
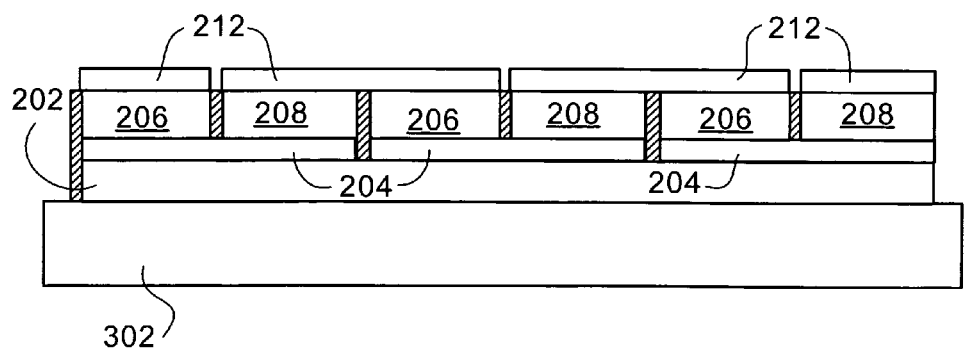

FIG. 3h is a cross sectional side view that illustrates top electrodes 212 formed on the first and second sets of electrodes 206, 208, according to one embodiment. The top electrodes 212 may be formed similarly to the bottom electrodes 204, and may comprise the same materials as the bottom electrodes 204 and be the same or similar size as the bottom electrodes 204, as described with respect to FIG. 3b.

Referring again to FIG. 2, a top layer 214 on the top electrodes 212 may be formed in an embodiment. The handling or support structure 302 may removed from the substrate 202. Additionally, if multiple devices 200 are formed at once on a plurality of substrates 202 on a wafer, the devices may be singulated prior to use.

Figure 4:
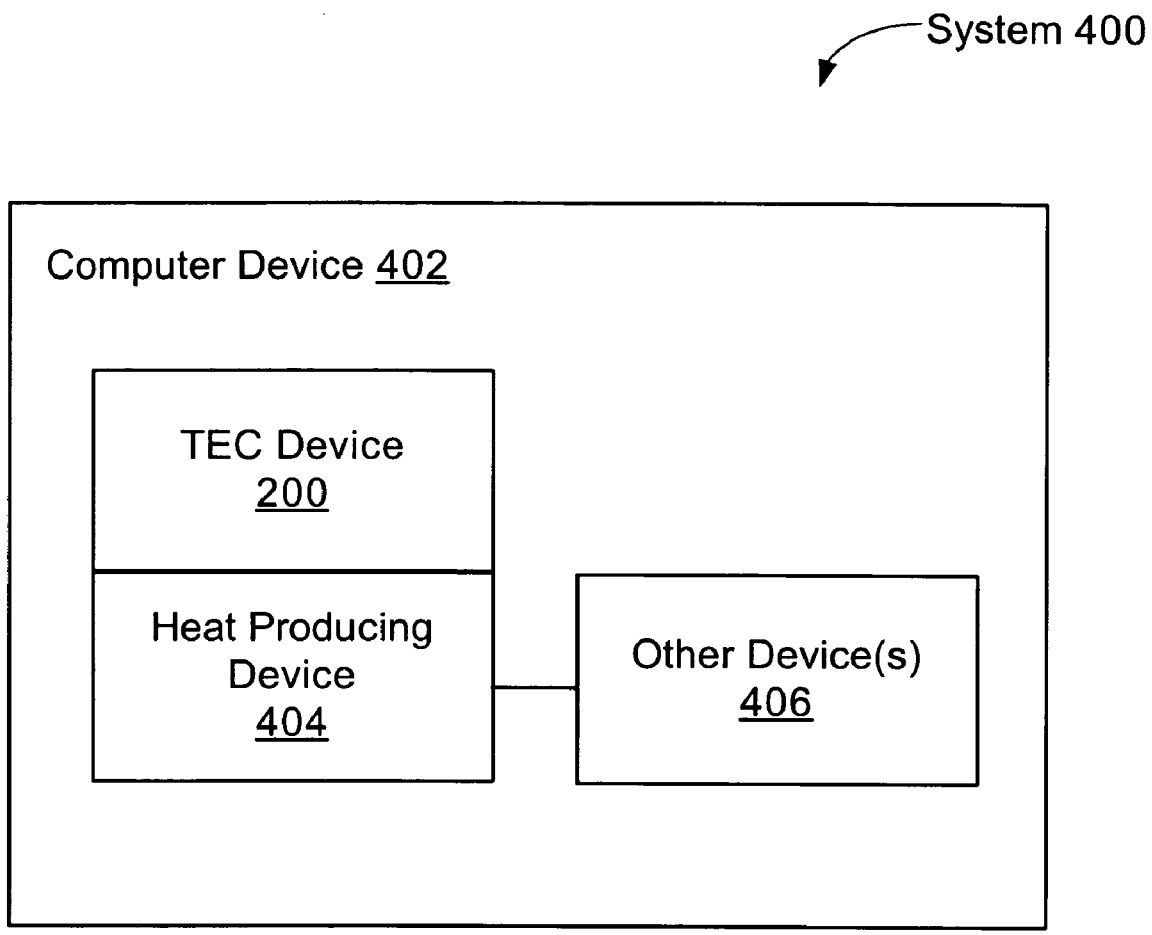
FIG. 4 is a schematic view that illustrates a system in which the thermoelectric cooler may be used to cool a heat producing device.

FIG. 4 is a schematic view that illustrates a system 400 in which the thermoelectric cooler 200 may be used to cool a heat producing device 404, according to one embodiment of the present invention. In the illustrated embodiment, the system 400 may include a computer device 402. The computer device 402 may include a microelectronic or other device 404 that produces heat. For example, the heat producing device 404 may be a microprocessor. In an embodiment, the thermoelectric cooling device 200 may be coupled to the heat producing device 404 to provide good transfer between the heat producing device 404 and the thermoelectric cooling device 200 that may remove the heat produced by the heat producing device 404. For example, the thermoelectric cooling device 200 may be coupled to a microelectronic die 404 so that the elements 206, 208 are close to "hot spots" (especially hot areas of the die) so that the thermoelectric cooling device 200 may efficiently remove heat. Alternatively, more than one thermoelectric cooling device 200 may be coupled to the heat producing device 404. An electricity source may be coupled to the thermoelectric cooling device 200 to allow the thermoelectric cooling device 200 to function. The die 404 or other type of heat producing device 404 may also be connected to other devices 406.

In another embodiment, the heat producing device 404 may be one or more devices that are formed on the substrate 202, on the side of the substrate 202 opposite the side on which the electrodes 204 and elements 206, 208 are formed. In such an embodiment, the thermoelectric cooler 200 and heat producing device 404 may not be separate components.

Figure 5:
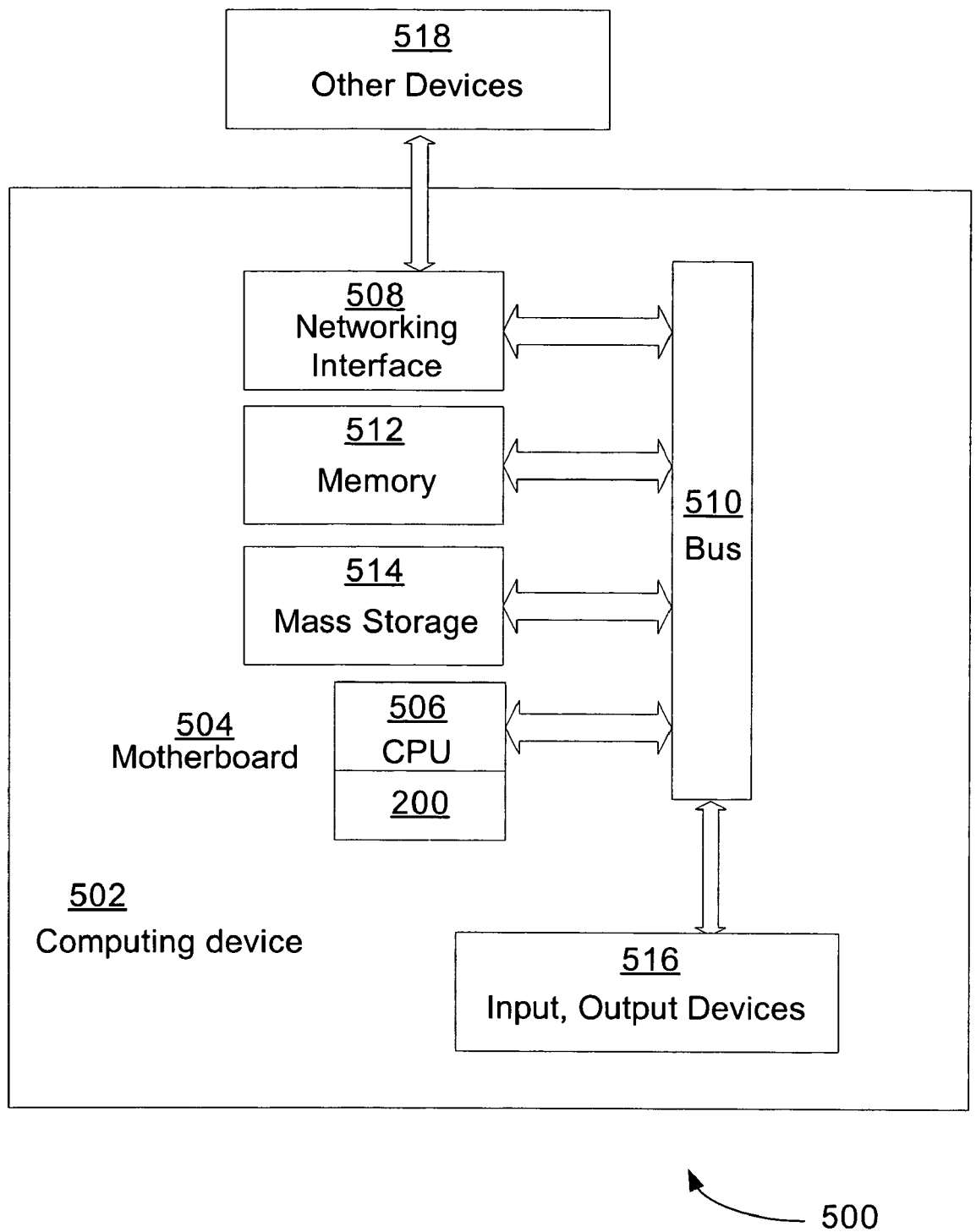
FIG. 5 illustrates a system in accordance with one embodiment of the present invention.

FIG. 5 illustrates a system 500 in accordance with one embodiment of the present invention. One or more thermoelectric coolers 200 described above may be included in the system 500 of FIG. 5 coupled to any other heat producing component in the system 500 to help keep that component cool. As illustrated, for the embodiment, system 500 includes a computing device 502 for processing data. Computing device 502 may include a motherboard 504. Motherboard 504 may include in particular a processor 506, and a networking interface 508 coupled to a bus 510.

Depending on the applications, system 500 may include other components, including but are not limited to volatile and non-volatile memory 512, a graphics processor, a digital signal processor, a crypto processor, a chipset, mass storage 514 (such as hard disk, compact disk (CD), digital versatile disk (DVD) and so forth), input and/or output devices 516, and so forth.

In various embodiments, system 500 may be a personal digital assistant (PDA), a mobile phone, a tablet computing device, a laptop computing device, a desktop computing device, a set-top box, an entertainment control unit, a digital camera, a digital video recorder, a CD player, a DVD player, or other digital device of the like.

Any of one or more of the components 506, 514, etc. in FIG. 5 may include one or more thermoelectric coolers 200 as described herein. For example, the CPU 506 is illustrated as being connected to a thermoelectric cooler 200, which may help keep the CPU 506 cool. Such thermoelectric coolers 200 may allow devices to function properly that would otherwise overheat.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, the term "top" and "bottom" electrodes is used to designate electrodes closer to and further from the substrate; in use the "top" electrode may actually be below the "bottom" electrode and still fall within the meaning of the term "top" electrode. The term "on" as used herein (including in the claims) does not indicate that a first layer "on" a second layer is directly on and in contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

We claim:

1. A method, comprising:

forming a plurality of bottom electrodes on a substrate;

after forming the first plurality of bottom electrodes, forming a first plurality of thermoelectric cooling elements on the plurality of bottom electrodes, the first plurality of thermoelectric cooling elements separated by a plurality of trenches;

after forming the first plurality of thermoelectric cooling elements, forming a insulating layer adjacent sides and bottoms of the plurality of trenches and tops of the first plurality of thermoelectric cooling elements; and after forming the insulating layer, forming a second plurality of thermoelectric cooling elements adjacent the insulating layer, each thermoelectric cooling element of the second plurality being formed between two thermoelectric cooling elements of the first plurality of thermoelectric cooling elements;

wherein one element of the first plurality of thermoelectric cooling elements and one element of the second plurality of thermoelectric cooling elements are formed on each of the plurality of electrodes.

2. The method of claim 1, wherein forming the first plurality of thermoelectric cooling elements comprises:

forming a layer of thermoelectric material; and removing portions of the thermoelectric material to result in the first plurality of thermoelectric cooling elements separated by the plurality of trenches.

3. The method of claim 1, wherein forming the insulating layer comprises forming a conformal insulating layer adjacent the sides and bottoms of the plurality of trenches and the tops of the first plurality of thermoelectric cooling elements, and further comprising removing portions of the conformal insulating layer at the bottoms of the plurality of trenches to expose at least portions of the plurality of bottom electrodes.

4. The method of claim 3, further comprising:

removing portions of the conformal insulating layer from the tops of the elements of the first plurality of thermoelectric cooling elements; and forming a plurality of top electrodes, each top electrode in contact with top surfaces of an element of the first plurality of thermoelectric cooling elements and an element of the second plurality of thermoelectric cooling elements.

5. The method of claim 1, wherein there is a distance between a first element of the first plurality of thermoelectric cooling elements and a second element of the second plurality of thermoelectric cooling elements that is closest to the first element, the first element and second element have widths, and the widths of the first and second elements are about ten times as great as the distance, or greater.

6. The method of claim 5, wherein the widths of the first and second elements are about fifty times as great as the distance, or greater.

7. The method of claim 1, wherein a packing density of the first and second pluralities of thermoelectric cooling elements is above about 70%.

8. The method of claim 7, wherein the packing density is above about 90%.

9. A device, comprising:

a substrate;

a first bottom electrode and a second bottom electrode formed on the substrate;

a first doped thermoelectric cooling element in direct contact with the first bottom electrode and having a width;

a second doped thermoelectric cooling element in direct contact with the first bottom electrode and having a width, the second doped thermoelectric cooling element being separated from the first doped thermoelectric cooling element by a first insulating layer, the second doped thermoelectric cooling element being doped oppositely to the first doped thermoelectric cooling element;

a third doped thermoelectric cooling element in direct contact with the second bottom electrode, the third doped thermoelectric cooling element being doped substantially the same as the first doped thermoelectric cooling element;

a second insulating layer separating the second doped thermoelectric cooling element and the third doped thermoelectric cooling element, and separating the first bottom electrode and the second bottom electrode;

wherein a top surface of the first, second, and third doped thermoelectric cooling elements is substantially planar with a top surface of the first and second insulating layers;

a first top electrode in direct contact with the second and third doped thermoelectric cooling elements and not in direct contact with the first doped thermoelectric cooling element; and wherein there is a distance between the first and second doped thermoelectric cooling elements, and the widths of the first and second doped thermoelectric cooling elements are about ten times as great as the distance, or greater.

10. The device of claim 9 wherein the distance is substantially equal to the thickness of the insulating layer.

11. The device of claim 9, wherein the first and third doped thermoelectric cooling elements are part of a first plurality of doped thermoelectric cooling elements, the second doped thermoelectric cooling element is part of a second plurality of doped thermoelectric cooling elements, and a packing density of the first and second pluralities of doped thermoelectric cooling elements is above about 70%.

12. The device of claim 11, wherein the packing density is above about 90%.

13. The device of claim 9, wherein the widths of the first and second doped thermoelectric cooling elements are about fifty times as great as the distance between the first and second doped thermoelectric cooling elements, or greater.

14. The device of claim 9, wherein the widths of the first and second doped thermoelectric cooling elements are each about 150 microns or less.

15. The device of claim 9, further comprising:

a second substrate;

a microelectronic die on the second substrate; and wherein the first substrate is coupled to the second substrate.

16. A method, comprising:

forming a layer of thermoelectric material, the layer covering a bottom electrode on a substrate;

removing a portion of the layer of thermoelectric material to form a first thermoelectric cooling element, a second thermoelectric cooling element, and a trench between the first and second thermoelectric cooling elements, wherein the first thermoelectric cooling element is on the bottom electrode and the second thermoelectric cooling element is not on the bottom electrode;

forming an insulating layer substantially conformal to top surfaces of the first and second thermoelectric cooling elements, and sides and bottom of the trench;

removing a portion of the insulating layer at the bottom of the trench to at least partially expose the bottom electrode; and forming a third thermoelectric cooling element in the trench.

17. The method of claim 16, wherein third thermoelectric cooling element is on the bottom electrode, and further comprising:

removing portions of the insulating layer from the top surfaces of the first and second thermoelectric cooling elements; and forming a top electrode on the first and third thermoelectric cooling elements, the top electrode not being on the second thermoelectric cooling element.

18. The method of claim 16, wherein there is a distance between the first thermoelectric cooling element and the third thermoelectric cooling element, the first element and third element have widths, and the widths of the first and third elements are about ten times as great as the distance, or greater.

19. The method of claim 16, wherein the first and second thermoelectric cooling elements are part of a first plurality of thermoelectric cooling elements, the third thermoelectric cooling element is part of a second plurality of thermoelectric cooling elements, and a packing density of the first and second pluralities of thermoelectric cooling elements is above about 70%.

* * * * *